Figure 1:
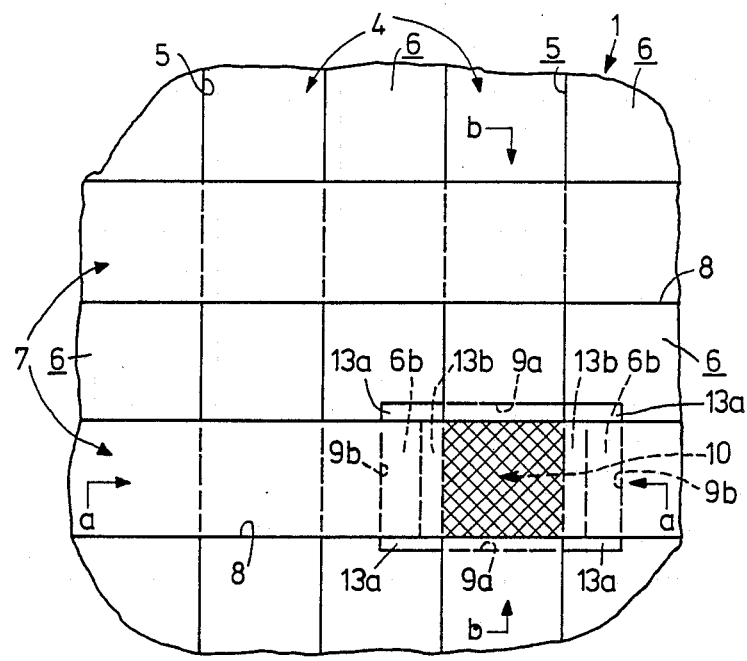

United States Patent [19]

Gootzen et al.

[11] Patent Number: 4,965,226
[45] Date of Patent: Oct. 23, 1990

[54] METHOD OF FORMING AN INTERCONNECTION BETWEEN CONDUCTIVE LEVELS

[75] Inventors: Wilhelmus F. M. Gootzen; Kazimierz Osinski, both of Eindhoven, Netherlands

[73] Assignee: U.S. Philips Corporation, New York, N.Y.

[21] Appl. No.: 465,560

[22] Filed: Jan. 16, 1990

Related U.S. Application Data

[63] Continuation of Ser. No. 229,377, Aug. 5, 1988, abandoned.

[30] Foreign Application Priority Data

Oct. 16, 1987 [GB] United Kingdom ............... 8724319

[51] Int. Cl.⁵ ............................................. H01L 21/90
[52] U.S. Cl. ............................... 437/189; 437/194; 437/195; 437/190; 437/192; 437/228; 437/231; 437/245
[58] Field of Search ............ 437/195, 225, 228, 189, 437/194, 231, 190, 192, 245; 156/643, 644

[56] References Cited

U.S. PATENT DOCUMENTS

| | | | |
|---|---|---|---|
| 4,619,839 | 10/1986 | Lehrer | 437/231 |
| 4,710,264 | 12/1987 | Waschler et al. | 437/228 |
| 4,719,125 | 1/1988 | Anello et al. | 437/231 |
| 4,768,962 | 11/1988 | Koch | 437/51 |
| 4,824,521 | 4/1989 | Kulkarni et al. | 156/662 |

FOREIGN PATENT DOCUMENTS

| | | | |
|---|---|---|---|
| 76889 | 6/1977 | Japan | 437/194 |
| 137656 | 10/1981 | Japan | 437/194 |
| 170550 | 10/1982 | Japan | 437/231 |
| 0208160 | 12/1982 | Japan | 437/192 |
| 0002031 | 1/1983 | Japan | 437/225 |
| 33865 | 2/1983 | Japan | 437/231 |
| 0112239 | 6/1984 | Japan | 437/189 |
| 245254 | 12/1985 | Japan | 437/231 |
| 164242 | 7/1986 | Japan | 437/194 |
| 0174650 | 8/1986 | Japan | 437/189 |
| 1308496 | 2/1973 | United Kingdom | 437/231 |

*Primary Examiner*—Brian E. Hearn
*Assistant Examiner*—Tuan Nguyen
*Attorney, Agent, or Firm*—Paul R. Miller

[57] ABSTRACT

A method of forming an interconnection between conductive levels is described in which a first conductive level (4) is provided on a surface of a substrate body such as a semiconductor body (1) so that the first conductive level (4) has a contact area (10). Passivating material (6) is provided on the surface of the body (1) to cover the first conductive level (4) and the contact area (10) is then exposed by opening in the passivating material (6) a window (9) larger than the contact area (10) so that there is a gap (11) between the periphery (9a) of the window (9) and a side wall (5a) of the first conductive level (4) bounding the contact area (10). After opening the window (9) material (13b) is provided in the gap (11). Preferably, the material is provided by applying and then solidifying a spin-on-glass and subsequently etching back the spin-on-glass to expose the contact area. A second conductive level (7) is then provided on the smoothed surface to smooth the surface between the periphery (9a) of the window (9) and the contact area (10) so that part of the second conductive level (7) contacts the area (10) within the window (9).

20 Claims, 3 Drawing Sheets

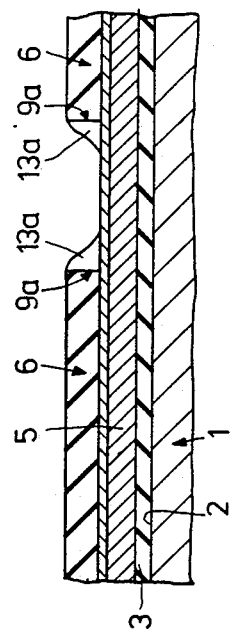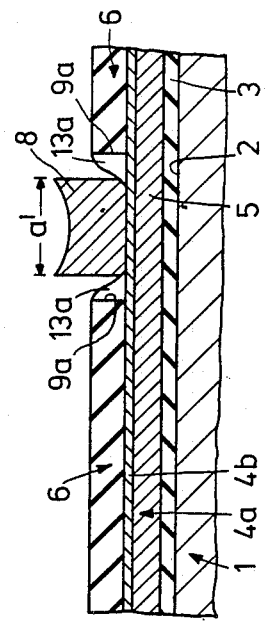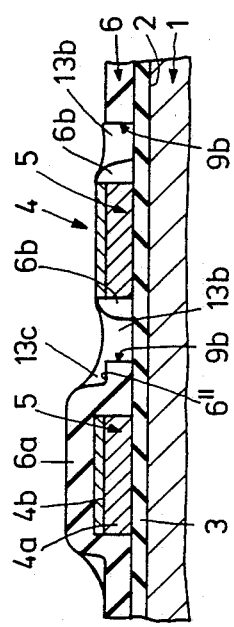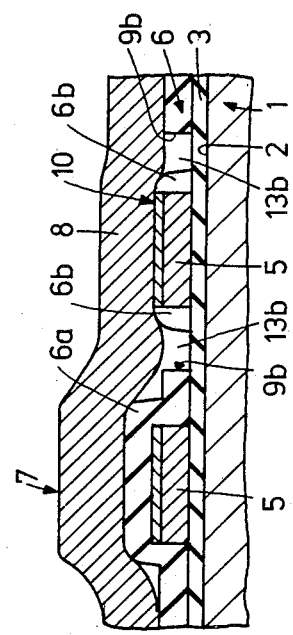

METHOD OF FORMING AN INTERCONNECTION BETWEEN CONDUCTIVE LEVELS

This application is a continuation application of Ser. No. 229,377, filed Aug. 5, 1988, now abandoned, and all benefits of such earlier application are hereby claimed for this new continuation application.

This invention relates to a method of forming an interconnection between multi-conductive levels, which method comprises providing a first conductive level on a surface of a substrate body so that the first conductive level has a contact area, providing passivating material on the surface of the body to cover the first conductive level, exposing the contact area by opening in the passivating material a window larger than the contact area so that there is a gap between the periphery of the window and a side wall of the first conductive level bounding the contact area and providing a second conductive level on top of the passivating material so that part of the second conductive level contacts the contact area within the window.

Such a method is disclosed in U.S. Pat. No. 4,594,606. As described in U.S. Pat. No. 4,594,606, the window in the passivating material covering the first conductive level is opened by etching the passivating material, which is silicon dioxide in the arrangement described, anisotropically, and using reactive ion etching, so as to expose the upper surface of the first conductive level. The use of an anisotropic etching technique means that fillets of silicon dioxide are left on side walls of the first conductive level bounding the contact area. As stated in U.S. Pat. No. 4,594,606, the fillets provided on the edges of the contact area are smooth and decrease gradually in thickness thereby smoothing out what would otherwise have been an abrupt step in the first conductive level which could have caused weaknesses and discontinuities in the subsequent second level.

Although the method described in U.S. Pat. No. 4,594,606 reduces the slope of the side walls bounding the contact area, the periphery of the window still provides a near vertical step over which the second conductive level has to be deposited and at which the aforementioned weaknesses and discontinuities in the second conductive level may occur. Furthermore, although the fillets or oxide spacers on the side walls bounding the contact area reduce the steepness of the side walls for a given window size, the fillets also decrease the area of the surface beneath the first conductive level exposed by the window and so it becomes difficult to ensure that the contact window is filled without resorting to the use of the commonly used but expensive technique of depositing a tungsten layer in the contact window.

According to one aspect of the invention, there is provided a method of forming an interconnection between conductive levels, which method comprises providing a first conductive level on a surface of a substrate body so that the first conductive level has a contact area, providing passivating material on the surface of the body to cover the first conductive level, exposing the contact area by opening in the passivating material a window larger than the contact area so that there is a gap between the periphery of the window and a side wall of the first conductive level bounding the contact area, and providing a second conductive level on top of the passivating material so that part of the second conductive level contacts the contact area within the window, characterised by, after opening the window, providing material in the gap to smooth the surface between the periphery of the window and the contact area prior to providing the second conductive level.

In a second aspect, the present invention provides a method of manufacturing a semiconductor device, which method comprises providing a first conductive level on a surface of a semiconductor body so that the first conductive level has a contact area, providing passivating material on the surface of the body to cover the first conductive level, exposing the contact area by opening in the passivating material a window larger than the contact area so that there is a gap between the periphery of the window and a side wall of the first conductive level bounding the contact area, and providing a second conductive level on top of the passivating material so that part of the second conductive level contacts the contact area within the window, characterized by, after opening the window, providing material in the gap to smooth the surface between the periphery of the window and the contact area prior to providing the second conductive level.

In a preferred embodiment, the method comprises providing the first conductive level as at least one conductive strip so that the contact area is on at least one conductive strip and is bounded by the elongated side walls of the strip, opening the window so that the window extends transversely over and is wider than the conductive strip and there is a gap between each elongated edge of the conductive strip and the periphery of the window, and providing the second conductive level as at least one conductive strip extending transversely over the conductive strip of the first conductive level.

A method embodying the invention thus enables the second conductive level to be deposited onto a surface which has been flattened or made more smooth by at least reducing the height of steps on the surface, thereby allowing the possibility of weakness or breaks in the second conductive level because of steep steps in the underlying surface to be reduced while allowing a contact window wider than the underlying contact area to be used.

Furthermore, a method embodying the invention enables problems of the filing the contact window to be overcome or at least reduced since material can be used to fill the contact window other than the material of the second conductive level.

Also, since a method embodying the invention should result in a relatively flat second conductive level, it should help alleviate problems of pattern shift where compressive stresses applied by subsequent plastic encapsulation may cause cracks in the final passivating layer, such as, for example a plasma nitride layer, provided over the second conductive level, and in underlying passivating layers because it is thought that such problems arise or are at least exacerbated by stepped surfaces that enable the enveloping plastic material to get a good grip on the surface so that removing or reducing such steps should alleviate these problems.

A layer of passivating material such as a dielectric may be provided on the surface of the body prior to the first conductive level. The first conductive level may comprise aluminium or another conductive material, such as doped polycrystalline silicon. The second conductive level may comprise aluminium, and may be, for example, an AlSi or AlCu layer.

The window may be opened by etching the passivating material anisotropically so as to leave fillets of passivating material on the two opposed edges of the contact area. The fillets of passivating material, for example of silicon dioxide, and an etch-stop layer which may be provided on the first conductive level, may serve to protect the first conductive level during subsequent processes required to define the second conductive level, for example during etching of an aluminium layer through a photolithographically defined mask so as to define separate conductive strips to form the second conductive level.

The material may be provided in the gap(s) by covering the surface with further passivating material and etching the passivation material to expose the contact area, for example by applying a medium which is flowable and then solidifiable to the surface. An insulating material dispersed in a solvent may be used as the medium which is flowable and then solidifiable. Preferably, the medium used is a spin-on-glass which, since it is applied as a liquid, flows preferentially to lower levels enabling the gap(s) to be filled while providing only a relatively thin covering layer of insulating material on the contact area, which relatively thin layer can be etched away relatively quickly and easily. The spin-on-glass should also enter niches or crevices in the passivating layer and thus reduce the height of or smooth any steps in the passivating layer thereby providing a smoother surface on which to provide the second conductive level avoiding or at least reducing the possibilities of weaknesses or undesired discontinuities in the second conductive level because of bad coverage on near vertical edges or steps and also avoiding or reducing the possibilities of undesired shorts between parts of the second conductive level which may otherwise occur if conductive material is left in steps or niches of the passivating layer after patterning of deposited conductive material to provide the desired second conductive level.

Embodiments of the invention will now be described, by way of example, with reference to the accompanying drawings, in which:

FIG. 1 is a schematic top plan view of part of a semiconductor device illustrating an interconnection between conductive levels formed using a method embodying the invention; and FIGS. 2 to 6 are schematic cross-sectional views illustrating, in sequence, various steps in a method embodying the invention, where FIGS. 2a, 3a, 4a, 5a and 6a are cross-sectional views taken along the line a—a in FIG. 1, and FIGS. 2b, 3b, 4b, 5b and 6b are cross-sectional views taken along the line b—b in FIG. 1.

Referring now to the drawings, it should of course be understood that the Figures are not to scale and that relative dimensions may have been altered in the interests of clarity in the drawings.

The Figures show part of a semiconductor body 1, in this example a monocrystalline silicon body, having double level metallisation. Although not shown, it will be appreciated that the semiconductor body will have doped regions forming semiconductor devices (such as, for example, bipolar transistors or insulated gate field effect transistors) for which the metallisation provides connections.

As shown, a surface 2 of the semiconductor body is covered by a passivating layer 3 of silicon dioxide on top of which is provided a first conductive or metallisation level 4. The first conductive level 4 is, in this example, provided in the form of parallel aluminium tracks or strips 5 of which only two are shown, although there may be many more.

A further layer 6 of passivating material is provided on top of the first conductive level 4 and the second metallisation level 7 in FIGS. 6a and 6b, in this example in the form of aluminium tracks or strips 8 extending transversely, as shown perpendicularly to the strips 5, is provided on the passivating layer 6 after forming a window or contact opening 9a or 9b in the passivating layer 6 to expose a contact area 10 of the first and second metallisation levels 4 and 7.

Figure 3B:
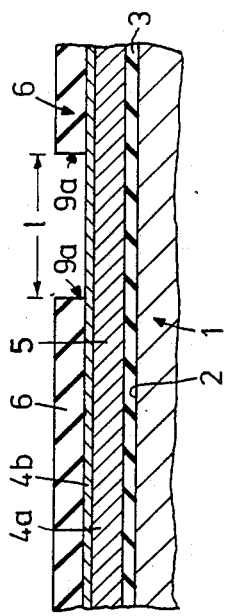
Figure 3A:
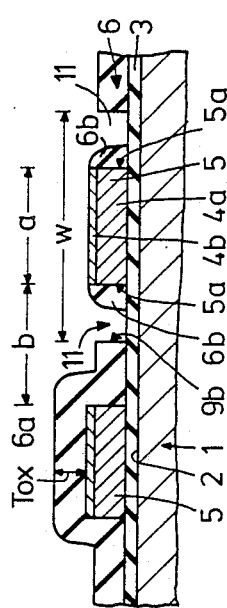

As can be seen from FIGS. 1, 3a and 3b especially, the contact area 10 (shown cross-hatched in FIG. 1 in the interests of clarity) is, in this example, rectangular and is bounded in one direction by two opposed elongated side walls 5a of the strip 5.

Again, although only two strips 8 are shown in FIG. 1, there may be many more and there may be more than one interconnection between the first and second metallisation levels 4 and 7.

A method of forming the first and second metallisation levels 4 and 7 and an interconnection between one strip 5 of the first metallisation level 4 and a strip 8 of the second metallisation level 7 which lies over the one strip 5 will now be described with reference to FIGS. 2 to 6.

Figure 2B:
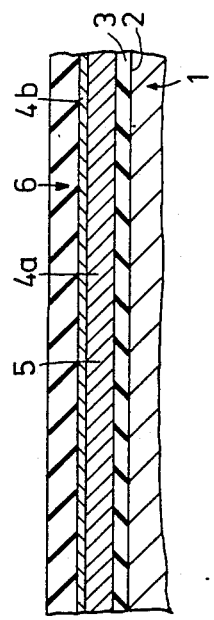
Figure 2A:
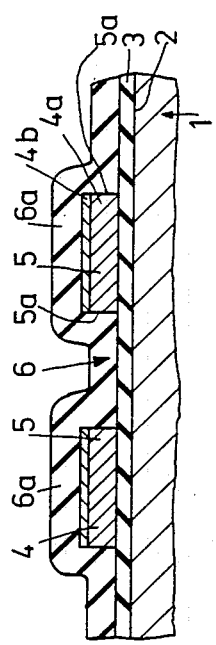

As shown in FIGS. 2a and 2b, after the layer 3 of thermally grown silicon dioxide has been provided on the surface 2 of the semiconductor body 1 and, if required, openings (not shown) formed in the layer 3 using conventional photolithographic and etching techniques to enable the subsequent metallisation to contact device regions of the semiconductor body 1, a layer 4a of aluminium is deposited onto the layer 3 to a thickness of, in this example, 500 nm (nanmeters) followed by a layer 4b of tungsten-titanium alloy to a thickness of, in this example, 100 nm.

The composite layer 4 is then patterned using conventional photolithographic and etching techniques to provide the conductive strips 5 of the first metallisation level 4. As will be appreciated, each strip 5 is thus a composite strip comprising the lower aluminium layer 4a and the upper alloy layer 4b. The strips 5 may, in this example, be 1.8 micrometers wide and may have a separation of 1.8 micrometers. Passivating material in the form of silicon dioxide is then deposited using a low temperature or plasma deposition technique so as to provide the passivating layer 6 covering the first metallisation level 4. In this example the passivating layer 6 is of the same thickness, that is 600 nm, as the thickness of the layers 4a and 4b.

Using conventional techniques, a photoresist layer (not shown) is provided on the passivating layer 6 and patterned to provide a window in the resist over the desired contact area 10 of the strip 5. The passivating layer 6 is then etched anisotropically, for example by reactive ion etching, to form, as shown in FIGS. 3a and 3b, the contact window or opening 9.

The dimensions of the contact opening 9 to be formed in the passivating layer 6 are, of course, determined by the selected dimensions of the window in the resist (not shown). The window in the resist is so dimensioned that the contact window 9 extends beyond each side wall 5a for a distance somewhat greater than the thickness Tox of the passivating layer 6 and the anisotropic etching through the resist window is controlled so as to stop at the tungsten-titanium alloy layer 4b which thus acts as an etch-stop barrier. This leaves fillets 6b of the passivating material, in this example silicon dioxide, on the side walls 5a of the strip 5.

The precise width w of the contact opening 9 will be determined by the particular processing conditions and tolerances but may, where, as described above, the thickness Tox of the passivating layer 6 is 0.6 micrometers and the width of the strip 5 is 1.8 micrometers, be 4 micrometers. The length 1 of the contact opening 9 will be determined, as will be described below, by the desired dimension of the contact area 10 and of course taking into account processing conditions and tolerances.

The opening of the contact window 9 to expose the contact area 10 provides, in the direction of the width w of the contact window 9, a respective gap 11 in the passivating layer 6 on each side of the contact area 10, each of the two gaps being defined between a respective side wall 9b of the periphery of the contact window 9 and the adjacent fillet 6b.

Before the second conductive level 7 is provided, material is provided in the gaps 11 to planarise, that is to smooth or flatten the surface between the periphery of the window and the contact area.

In this example, the material is a planarising medium which is initially flowable and so can be applied to the surface so as to enter any cracks or crevices and thus fill the gaps 11 and which can then be set or solidified. Preferably the medium is a spin-on-glass which when heated, after application to the surface to evaporate the carrier solvent, solidifies or sets to form a glassy layer of silicon dioxide. There are many different types of spin-on-glass which may be suitable for present purposes. Thus, for example, the spin-on-glass may comprise phenylsiloxane in l-propanol as in the case of, for example, the spin-on-glass produced by Allied Chemical Co. of the United States of America under the trade name Accuglass 204, or methylphenylsiloxane in 1-propanol as in the case of, for example, the spin-on-glass produced by Allied Chemical Co. under the trade name Accuglass 108 or phosphorus doped silanol in ethanol as in the case of, for example, the spin-on-glass produced by Tokyo Otika Kogyo Co. of Japan under the trade name P48340 or any other suitable spin-on-glass.

The spin-on-glass is applied to the surface of the semiconductor body 1 while the semiconductor body or wafer 1 is rotated so as to spread the spin-on-glass solution evenly. The amount of solution applied is, for example, selected to be that which would produce a layer 50 to 100 nm thick on a flat test wafer of the same surface area.

The spin-on-glass thus flows over the surface entering the crevices and niches so as to flatten or smooth the surface and reduce the height of any steps in the surface. The spin-on-glass flows preferentially to the lowest level on the surface and so will preferentially fill the gaps 11 while providing a thinner covering on relatively higher surface areas.

The degree of planarisation or smoothing of the surface, that is the amount by which any steps in the surface are reduced, may be controlled by controlling the concentration of the silica medium, for example methylsiloxane, in the alcohol solvent.

Figure 4B:
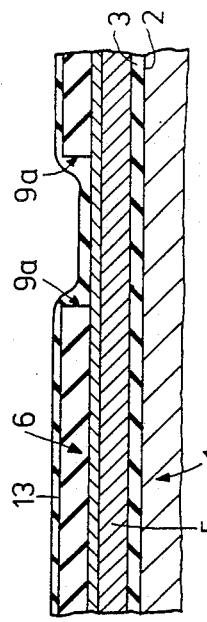
Figure 4A:
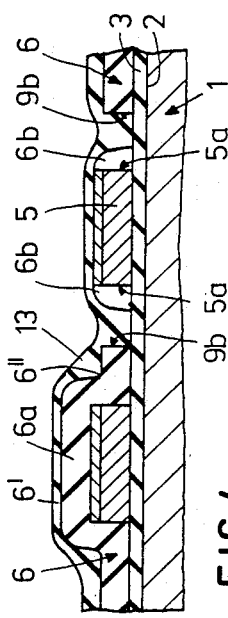

The semiconductor body 1 is then heated to evaporate off the alcohol solvent in the spin-on-glass and so leave a glassy electrically insulating layer 13 of silicon oxide 13. As will be appreciated from above, because of the initial flowable properties of the spin-on-glass, the layer 13 should be, as shown in FIGS. 4a and 4b, thinnest on top of the steps in the passivating layer 6, that is on the top surfaces 6' of the highest or thickest regions and thickest within the contact window 9 and in the niches or crevices 6" defined by the steps in the passivating layer. This thickness of the layer 13 on top of the contact area 10 of the strip should be intermediate these two extremes.

The layer 13 is then etched back uniformly over the surface of the semiconductor body 1 using any suitable conventional wet or dry etching technique until the top surface of the alloy layer 4b is exposed. As shown in FIGS. 5a and 5b, the gaps 11 and any other crevices or steps in the surface remain filled with the insulating material 13b formed by the solidified spin-on-glass. Fillets 13a of the solidified spin-on-glass are also left on the elongated wide walls 9a of the periphery of the contact window 9, that is the side walls extending across the strip 5. The width of the contact area 10 across the strip 5 is thus determined by the side walls 5a of the strip 5 while the length of the contact area 10 along the strip 5 is determined by the length 1 of the contact window 9 and by the fillets 13a.

Next, as illustrated in FIGS. 6a and 6b, a second aluminium-containing conductive layer, for example AlSi or AlCu and in this example, 1000nm in thickness, is deposited on the planarised passivating layer. Using conventional photolithographic and etching techniques, the second conductive layer is patterned to define the second conductive level 7. As indicated above, in this example, the second conductive level 7 comprises parallel strips or tracks 8 extending transversely, as shown perpendicularly, to the strips or tracks 5. The strips or tracks 8 may have a width a' of 1.8 micrometers and may be separated by the same distance.

During etching to pattern the second aluminium layer, there is a danger of further undesired etching of the first aluminium layer. However, in the present arrangement, this possible undesired etching may be prevented or at least reduced because the alloy layer 4b protects the top surface of the contact area 10 while the fillets 6b serve to protect the edges of the strip 5 from being eroded during the etching, the dielectric material, in this example silicon dioxide, of the passivating layer 6 being less susceptible to attack by the aluminium etchant than the remaining solidified spin-on-glass.

The spin-on-glass also serves, as indicated above, to smooth or flatten other steps or crevices in the passivating layer. Thus, for example as shown in FIGS. 5a to 6b, the niches 6" in the passivating layer 6 are filled with solidified spin-on-glass 13c so reducing the height of or smoothing out the step in the surface. Thus a smoother surface is provided onto which the second conductive level is deposited so reducing the possibilities of weaknesses or discontinuities which may otherwise occur in the aluminium track if there were sharp discontinuities and vertical edges in the surface on which the aluminium is deposited. Also, as will be appreciated, it can be extremely difficult to ensure that an etchant removes material from crevices or niches such as the niche 6" and accordingly where such crevices or niches exist, undesired aluminium may remain after patterning of the second conductive level and such undesired aluminium may cause shorting of adjacent strips 8. The fact that the niches 6" are filled or at least flattened out by the solidified spin-on-glass 13 should at least reduce such problems. As shown in FIGS. 6a and 6b, the strip 8 overlying the one strip 5 thus interconnects with or contacts with the underlying contact area 10 of the one strip 5 via the contact window 9.

Materials other than flowable and then solidifiable or settable materials such as spin-on-glass may be used to fill the gaps 11. For example a low temperature silicon oxide could be deposited onto the surface so as to fill the gaps 11 and then etched back to expose the alloy layer 4b, although this would not have the covering and crack-filling properties associated with a flowable material like spin-on-glass.

In the arrangement described above, the passivating layer 6 is etched anisotropically to leave the fillets 6b on the side walls 5a. However, when opening the contact window 9, the passivating layer 6 may be etched, for example isotropically, so that no fillets are left and the side walls 5a are exposed. However, as indicated above, the fillets 6b assist in protecting the side walls 5a from attack by the etchant during patterning of the second conductive level. The fillets 6b also reduce, for a given size of contact window 9, the volume of the gaps 11 required to be filled by the spin-on-glass and the spin-on-glass should fill such smaller gaps more evenly and consistently than larger gaps.

Similarly the first and second conductive levels need not necessarily be in the form of parallel strips but each could adopt any desired conductive pattern. Furthermore, the conductive levels may be formed of other conductive materials or laminates of two or more different conductive materials, for example the first conductive level could be a doped polycrystalline silicon level.

The first conductive level could in some circumstances be provided directly on the surface of the substrate body.

Also the method may be applied where one or more further conductive levels are provided over the second conductive level in a similar manner to that in which the second conductive level is provided over the first conductive level.

A method embodying the invention may be used where the substrate body is other than monocrystalline silicon, such as for example where the substrate body comprises one or more different semiconductor materials, such as III–V compounds. Also, a method embodying the invention may be used where the substrate body is other than a semiconductor body, for example in liquid crystal technology.

From reading the present disclosure, other modifications will be apparent to persons skilled in the art. Such modifications may involve other features which are already known and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A method of forming an interconnection between conductor levels comprising the steps of
   (a) providing a first conductive level on a surface of a substrate body, said first conductive level having at least one contact area;
   (b) providing a passivating material over said surface to cover said first conductive level;
   (c) anisotropically etching said passivating material to form at least one window over said contact area, said window being larger than said contact area such that gaps are provided between side walls of said first conductive level and peripheries of said window, said anisotropic etching leaving fillets of said passivating material at said side walls, thereby minimizing said gaps;
   (d) providing smoothing material over each of said passivating material, said gaps, and said contact area to form smooth surfaces, said smoothing material being thinner over said passivating material and said contact area than over said gaps;
   (e) etching said smoothing material from said contact area to expose a top surface of said contact area; and
   (f) providing a second conductive level on said passivating material, said second conductive level having portions extending into said window and contacting said first conductive level at said contact area.

2. A method according to claim 1, wherein said first conductive level is provided as at least one conductive strip, said at least one contact area being formed at said conductive strip, and said contact area is bounded by elongated side walls of said conductive strip, wherein said at least one window is opened to extend transversely over said conductive strip, by a distance wider than said conductive strip, said gaps being 3. A method according to claim 1 or 2, wherein an etch-stop layer is provided on said first conductive level.

4. A method according to claim 3, wherein said etch-stop layer is a tungsten-titanium alloy.

5. A method according to claim 2, wherein said distance is greater than a thickness of said side walls formed by each elongated edge of said conductive strip and said peripheries of said window, and wherein said second conductive level is provided as at least one other conductive strip, said other conductive strip extending transversely to said at least one conductive strip of said first conductive level.

6. A method according to claim 1, wherein said smoothing material is a further passivating material.

7. A method according to claim 6, wherein said smoothing material is a medium being first flowable then solidifiable.

8. A method according to claim 7, wherein said medium is spin-on-glass dispersed in a solvent, said solvent being evaporated off to form said solidifiable medium.

9. A method of manufacturing a semiconductor device comprising the steps of
   (a) providing a first conductive level on a surface of a semiconductor body, said first conductive level having at least one contact area;
   (b) providing a passivating material over said surface to cover said first conductive level;
   (c) anisotropically etching said passivating material to form at least one window over said contact area, said window being larger than said contact area such that gaps are provided between side walls of said first conductive level and peripheries of said window, said anisotropic etching leaving fillets of said passivating material at said side walls, thereby minimizing said gaps;

(d) providing smoothing material over each of said passivating material, said gaps, and said contact areas to form smooth surfaces, said smoothing material being thinner over said passivating material and said contact area than over said gaps;

(e) etching said smoothing material from said contact area to expose a top surface of said contact area; and (f) providing a second conductive level on said passivating material, said second conductive level having portions extending into said window and contacting said first conductive level at said contact area.

10. A method according to claim 9, wherein said first conductive level is provided as at least one conductive strip, said at least one contact area being formed at said conductive strip, and said contact area is bounded by elongated side walls of said conductive strip, wherein said at least one window is opened to extend transversely over said conductive strip, by a distance wider than said conductive strip, said gaps being formed by each elongated edge of said conductive strip and said peripheries of said window, and wherein said second conductive level is provided as at least one other conductive strip, said other conductive strip extending transversely to said at least one conductive strip of said first conductive level.

11. A method according to claim 10, wherein said smoothing material is a further passivating material.

12. A method according to claim 11, wherein said smoothing material is a medium being first flowable then solidifiable.

13. A method according to claim 12, wherein said medium is insulating material dispersed in a solvent, said solvent being evaporated off to form said solidifiable medium.

14. A method according to claim 13, wherein said medium is spin-on-glass.

15. A method according to claim 14, wherein an etch-stop layer is provided on said first conductive level.

16. A method according to claim 15, wherein said etch-stop layer is a tungsten-titanium alloy.

17. A method according to claim 10, wherein said distance is greater than a thickness of said side walls.

18. A method according to claim 9, wherein an etch-stop layer is provided on said first conductive level.

19. A method according to claim 18, wherein said etch-stop layer is a tungsten-titanium alloy.

20. A method according to claim 9, wherein said smoothing material is a passivating material which is a medium being first flowable then solidifiable.

* * * * *